(12) United States Patent
Shin et al.

(10) Patent No.: US 12,369,359 B2
(45) Date of Patent: Jul. 22, 2025

(54) THIN FILM STRUCTURE AND ELECTRONIC DEVICE INCLUDING TWO-DIMENSIONAL MATERIAL

(71) Applicant: Samsung Electronics Co., Ltd., Suwon-si (KR)

(72) Inventors: Keunwook Shin, Yongin-si (KR); Kyung-Eun Byun, Seongnam-si (KR); Sangsoo Lee, Seongnam-si (KR); Changhyun Kim, Seoul (KR); Changseok Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 17/703,201

(22) Filed: Mar. 24, 2022

(65) Prior Publication Data
US 2023/0123234 A1 Apr. 20, 2023

(30) Foreign Application Priority Data
Oct. 18, 2021 (KR) .................. 10-2021-0138835

(51) Int. Cl.
| | | |
|---|---|---|
| *H10D 30/00* | (2025.01) |
| *H10B 43/27* | (2023.01) |
| *H10B 51/20* | (2023.01) |
| *H10D 30/67* | (2025.01) |
| *H10D 62/80* | (2025.01) |

(52) U.S. Cl.
CPC ......... *H10D 30/6757* (2025.01); *H10B 43/27* (2023.02); *H10B 51/20* (2023.02); *H10D 62/882* (2025.01)

(58) Field of Classification Search
CPC ........... H01L 29/786; H01L 29/78696; H10B 43/20; H10B 43/27; H10B 43/30; H10D 30/6757
See application file for complete search history.

(56) References Cited

U.S. PATENT DOCUMENTS

| | | |
|---|---|---|
| 8,476,765 B2 | 7/2013 | Zhang et al. |
| 8,541,769 B2 | 9/2013 | Chu et al. |
| 9,482,960 B2 | 11/2016 | Yakunin et al. |

(Continued)

FOREIGN PATENT DOCUMENTS

| | | |
|---|---|---|
| EP | 3125291 A1 | 2/2017 |
| KR | 2019/0045636 A | 5/2019 |

(Continued)

OTHER PUBLICATIONS

Extended European Search Report dated Oct. 31, 2022, issued in corresponding European Patent Application No. 22172275.4.

(Continued)

*Primary Examiner* — Reema Patel
(74) *Attorney, Agent, or Firm* — HARNESS, DICKEY & PIERCE, P.L.C.

(57) ABSTRACT

Provided is a thin film structure including a substrate, a metal layer on the substrate and spaced apart from the substrate, and a two-dimensional material layer between the substrate and the metal layer. The two-dimensional material layer may be configured to limit and/or block an electron transfer between the substrate and the metal layer. A resistivity of a metal layer on the two-dimensional material layer may be lowered by the two-dimensional material layer.

20 Claims, 23 Drawing Sheets

(56) References Cited

U.S. PATENT DOCUMENTS

| | | |
|---|---|---|
| 10,312,329 B2 | 6/2019 | Zhou |
| 2016/0351491 A1 | 12/2016 | Lee et al. |
| 2017/0033003 A1* | 2/2017 | Song ..................... H01L 29/45 |
| 2019/0148499 A1 | 5/2019 | Lin et al. |
| 2019/0348466 A1 | 11/2019 | Pillarisetty et al. |
| 2019/0371810 A1* | 12/2019 | Saito ................... H01L 29/7926 |
| 2019/0393042 A1 | 12/2019 | Singha Roy et al. |
| 2020/0211839 A1 | 7/2020 | Salahuddin et al. |
| 2021/0020835 A1 | 1/2021 | Lee et al. |
| 2021/0167021 A1 | 6/2021 | Wu et al. |
| 2022/0320135 A1* | 10/2022 | Oh .................... H01L 29/40117 |
| 2022/0415801 A1 | 12/2022 | Shin et al. |
| 2023/0017244 A1 | 1/2023 | Shin et al. |

FOREIGN PATENT DOCUMENTS

| | | |
|---|---|---|
| KR | 102207764 B1 | 1/2021 |
| KR | 2021/0052172 A | 5/2021 |

OTHER PUBLICATIONS

A. Chaves et al., 'Bandgap engineering of two-dimensional semiconductor materials' *nature partner journals 2D Materials and Applications*, 4:29, 2020.

European Office Action dated Feb. 13, 2025 for corresponding European Patent Application No. 22172275.4.

Christian Monzio Compagnoni et al., "Reviewing the Evolution of the NAND Flash Technology", Technology. Proceedings of the IEEE, 105(9), 1609-1633. (2017).

\* cited by examiner

THIN FILM STRUCTURE AND ELECTRONIC DEVICE INCLUDING TWO-DIMENSIONAL MATERIAL

CROSS-REFERENCE TO RELATED APPLICATION

This application is based on and claims priority under 35 U.S.C. § 119 to Korean Patent Application No. 10-2021-0138835, filed on Oct. 18, 2021, in the Korean Intellectual Property Office, the disclosure of which is incorporated by reference herein in its entirety.

BACKGROUND

1. Field

The present disclosure relates to thin film structures and/or electronic devices including a two-dimensional material.

2. Description of the Related Art

According to the tendency of down-scaling electronic apparatuses, the spaces occupied by electronic devices in electronic apparatuses have been reduced. Accordingly, along with the reduction in size of electronic devices, thin films used in the electronic devices may be required to have a smaller thickness and the same performance. Materials to block a charge transfer between adjacent layers have been used so that the characteristics of material layers having various functions in an electronic device, for example, a gate, a channel, a memory layer, etc., may be maintained. Such blocking materials are generally provided in a multi-layer structure functioning as a blocking layer, a diffusion barrier, and a liner, which leads to increased process expenses and time. Further, according to the film characteristics of a blocking material, a resistivity of a conductive material formed thereon may be increased.

SUMMARY

Provided are thin film structures and electronic devices with improved performance in blocking a charge transfer between adjacent material layers.

Additional aspects will be set forth in part in the description which follows and, in part, will be apparent from the description, or may be learned by practice of the presented embodiments of the disclosure.

According to an embodiment, a thin film structure may include a substrate, a metal layer on the substrate and spaced apart from the substrate, and a two-dimensional material layer between the substrate and the metal layer. The two-dimensional material layer may be configured to block an electron transfer between the metal layer and the substrate.

In some embodiments, a resistivity of the metal layer may be lowered by the two-dimensional material layer.

In some embodiments, the two-dimensional material layer may include a two-dimensional insulator.

In some embodiments, the two-dimensional insulator may include BN, $MnO_2$, MoOs, GaSe, $Ga_2N_3$, or $As_2S_3$.

In some embodiments, the thin film structure may further include a graphene layer between the two-dimensional material layer and the metal layer.

In some embodiments, the metal layer may be directly on the graphene layer.

In some embodiments, the metal layer may include W, Mo, Co, Ru, Rh, or Ir.

In some embodiments, the metal layer may be directly on the two-dimensional material layer.

In some embodiments, the two-dimensional material layer may be directly on the substrate.

In some embodiments, a ferroelectric layer may be between the two-dimensional material layer and the metal layer.

In some embodiments, a graphene layer may be between the ferroelectric layer and the two-dimensional material layer.

According to an embodiment, an electronic device may include a channel layer including a semiconductor material, a gate electrode on the channel layer and spaced apart from the channel layer, and a two-dimensional material layer between the channel layer and the gate electrode. The two-dimensional material layer may be configured to block an electron transfer between the gate electrode and the channel layer.

In some embodiments, the two-dimensional material layer may include a two-dimensional insulator.

In some embodiments, the two-dimensional insulator may include BN, $MnO_2$, $MoO_3$, GaSe, $Ga_2N_3$, or $As_2S_3$.

In some embodiments, the electronic device may further include a graphene layer between the two-dimensional material layer and the gate electrode.

In some embodiments, the electronic device may further include a charge trap layer between the channel layer and the two-dimensional material layer.

In some embodiments, the charge trap layer may include a trap layer and a tunneling oxide layer.

In some embodiments, the channel layer may include poly-Si.

In some embodiments, the electronic device may include a plurality of memory cells that each include the channel layer, the charge trap layer, the two-dimensional material layer, and the gate electrode. The plurality of memory cells may be arranged in a direction perpendicular to a direction in which the channel layer, the charge trap layer, and the two-dimensional material layer, and the gate electrode are arranged.

In some embodiments, the electronic device may further include a column-shaped insulator. The channel layer, the charge trap layer, the two-dimensional material layer, and the gate electrode may surround a lateral side of the column-shaped insulator. The channel layer may be between the lateral side of the column-shaped insulator and the two-dimensional material layer. The charge trap layer may be between the channel layer and the two-dimensional material layer.

In some embodiments, the electronic device may further include a graphene layer between the gate electrode and the two-dimensional material layer.

In some embodiments, the electronic device may further include a ferroelectric layer between the gate electrode and the two-dimensional material layer, and a conductive layer between the ferroelectric layer and the two-dimensional material layer.

In some embodiments, the electronic device may further include a graphene layer between the two-dimensional material layer and the conductive layer.

In some embodiments, the electronic device may further include a capacitor electrically connected to an end of the channel layer.

According to an embodiment, an electronic apparatus may include a memory device including a plurality of memory cells and a memory controller configured to control the memory device Each of the plurality of memory cells may include a channel layer, a gate electrode, a two-dimensional material layer, and a memory layer. The channel layer may include a semiconductor material. The gate electrode may be on the channel layer and spaced apart from the channel layer. The two-dimensional material layer may be between the channel layer and the gate electrode. The two-dimensional material layer may be configured to block an electron transfer between the gate electrode and the channel layer. The memory layer may be between the channel layer and the gate electrode.

In some embodiments, the memory layer may include a ferroelectric layer or a charge trap layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
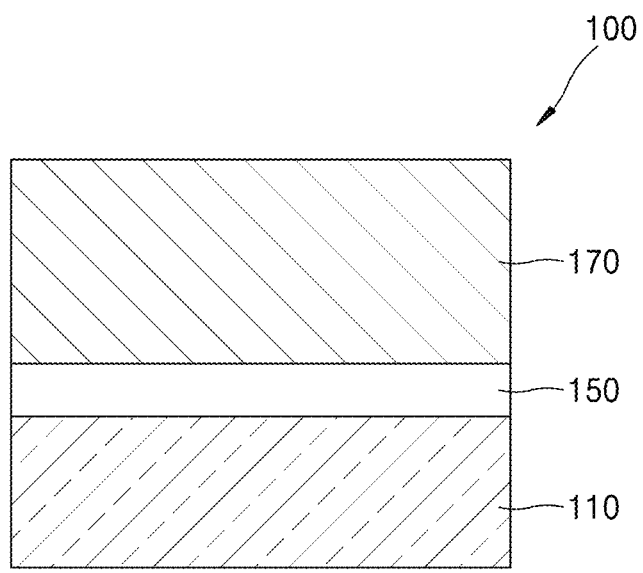
FIG. 1 is a cross-sectional view illustrating a schematic structure of a thin film structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, embodiments are described in detail with reference to the accompanying drawings. Embodiments described below are provided merely as an example, and various modifications may be made from the embodiments. In the drawings, like reference numerals denote like components, and sizes of components may be exaggerated for clarity and convenience of explanation.

It will be understood that when a component is referred to as being "on" or "above" another component, the component can be directly on the other component or intervening structures may be present and the component may be on the other component in a non-contact manner.

While such terms as "first," "second," etc., may be used to describe various components, the above terms are used only to distinguish one component from another. These terms are not intended to limit differences in materials or structures of the components.

An expression used in the singular encompasses the expression of the plural, unless it has a clearly different meaning in the context. When a portion "includes" a component, another component may be further included, rather than excluding the existence of the other component, unless otherwise described.

Also, the terms " . . . portion," "module," etc. used in the specification may refer to a unit performing at least one function or operation, and may be implemented by a hardware, a software, or a combination thereof.

The use of the terms "a" and "an" and "the" and similar referents in the context of describing embodiments are to be construed to cover both the singular and the plural.

Also, the steps of all methods described herein can be performed in any suitable order unless otherwise indicated herein. The use of any and all examples, or some example language (e.g., "such as") provided herein, is intended merely to better illuminate embodiments and does not pose a limitation on the scope of embodiments unless otherwise claimed.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

FIG. 1 is a cross-sectional view illustrating a schematic structure of a thin film structure according to an embodiment.

A thin film structure 100 may include a substrate 110, a metal layer 170 arranged on and spaced apart from the substrate 110, and a two-dimensional (2D) material layer 150 arranged between the substrate 110 and the metal layer 170.

The substrate 110 may be a substrate including a dielectric or semiconductor material. The substrate 110 may have a structure of various patterns including a conductive material and an insulator.

The metal layer 170 may include a metal material such as W, Mo, Co, Ru, Rh, or Ir, etc. and may also include various other conductive materials.

The 2D material layer 150 may be provided to limit and/or block the electron transfer between the substrate 110 and the metal layer 170, and may include a 2D insulator. The 2D material layer 150 may include, for example, BN, h-BN, $MnO_2$, $MoO_3$, GaSe, $Ga_2N_3$, or $As_2S_3$. The 2D material layer 150 may not only limit and/or prevent the charge transfer and atom transfer between the substrate 110 and the metal layer 170 but also lower the resistance of the metal layer 170 by functioning as a liner for the metal layer 170 deposited on the 2D material layer 150.

Figure 2A:
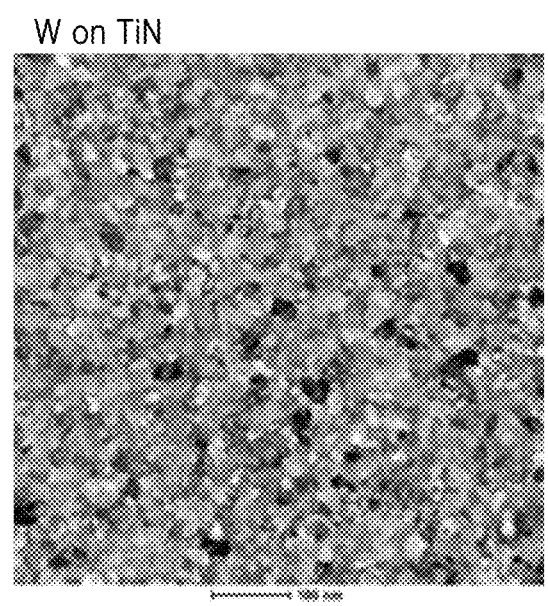
FIGS. 2A and 2B are microphotographs showing a grain size of a metal layer included in a thin film structure according to a comparative example and an embodiment, respectively.
Figure 2B:
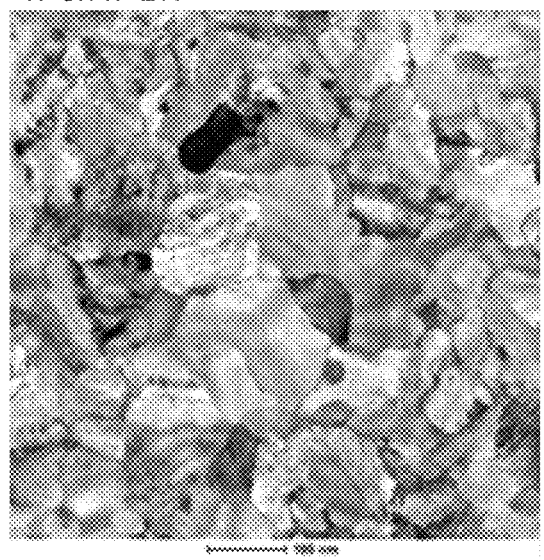
Figure 2C:
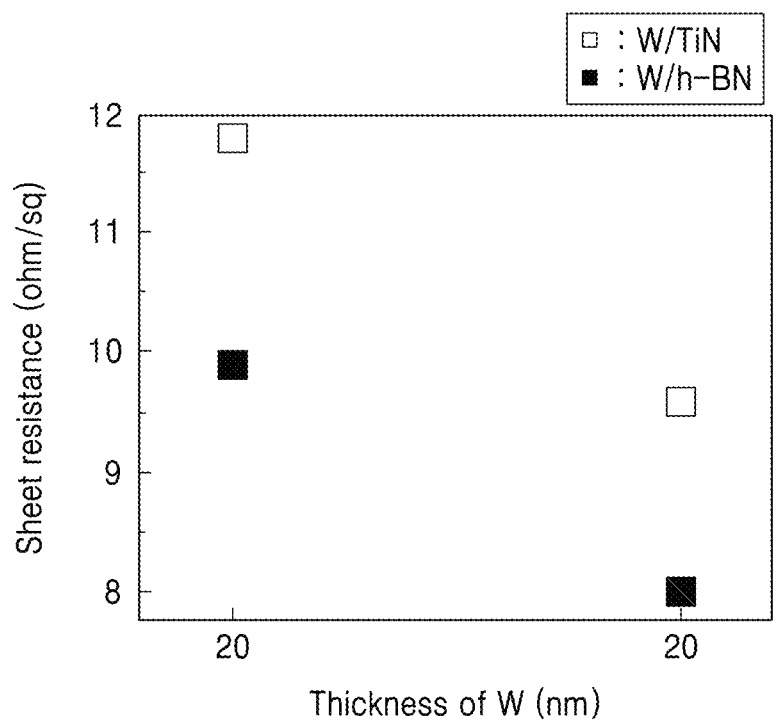
FIG. 2C is a graph showing a sheet resistance of a metal layer included in a thin film structure according to a comparative example and an embodiment.

FIGS. 2A and 2B are microphotographs showing a grain size of a metal layer included in a thin film structure according to a comparative example and an embodiment, and FIG. 2C is a graph showing a sheet resistance of a metal layer included in a thin film structure according to a comparative example and an embodiment.

FIG. 2A illustrates a comparative example of a PV-TEM image of a metal layer including W deposited on a TiN layer, and FIG. 2B is a PV-TEM image of a metal layer including W deposited on a h-BN layer according to an embodiment.

FIG. 2B shows grains formed several to tens of times greater than those in FIG. 2A. The grain size is a factor affecting resistivity, and with reference to FIG. 2C, a lower sheet resistance is shown in the comparative example (W/h-BN), compared to the comparative example (W/TiN).

Figure 3:
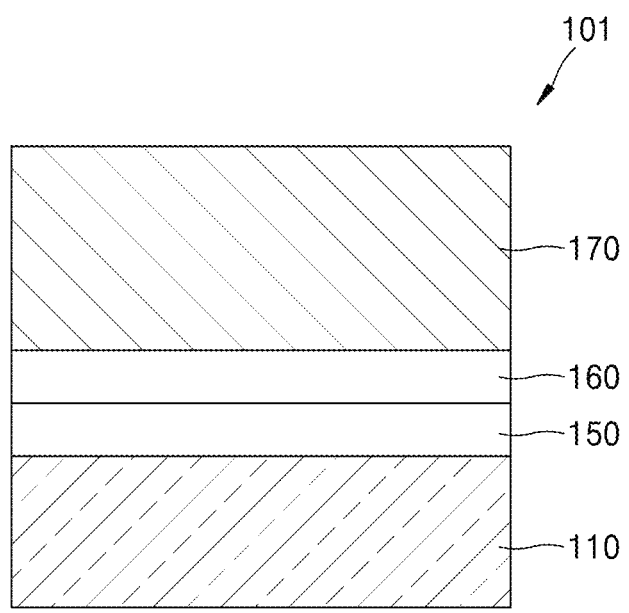
FIG. 3 is a cross-sectional view illustrating a schematic structure of a thin film structure according to another embodiment.

FIG. 3 is a cross-sectional view illustrating a schematic structure of a thin film structure according to another embodiment.

A thin film structure 101 of the embodiment may be different from the thin film structure 100 of FIG. 1 in that the thin film structure 101 further includes a graphene layer 160 between the 2D material layer 150 and the metal layer 170. The graphene layer 160 may function as a diffusion barrier. When the graphene layer 160 and the 2D material layer 150 including a 2D insulator are provided between the substrate 110 and the metal layer 170, various interactions which may occur between the metal layer 170 and the substrate 110 may be effectively limited and/or prevented.

Figure 4:
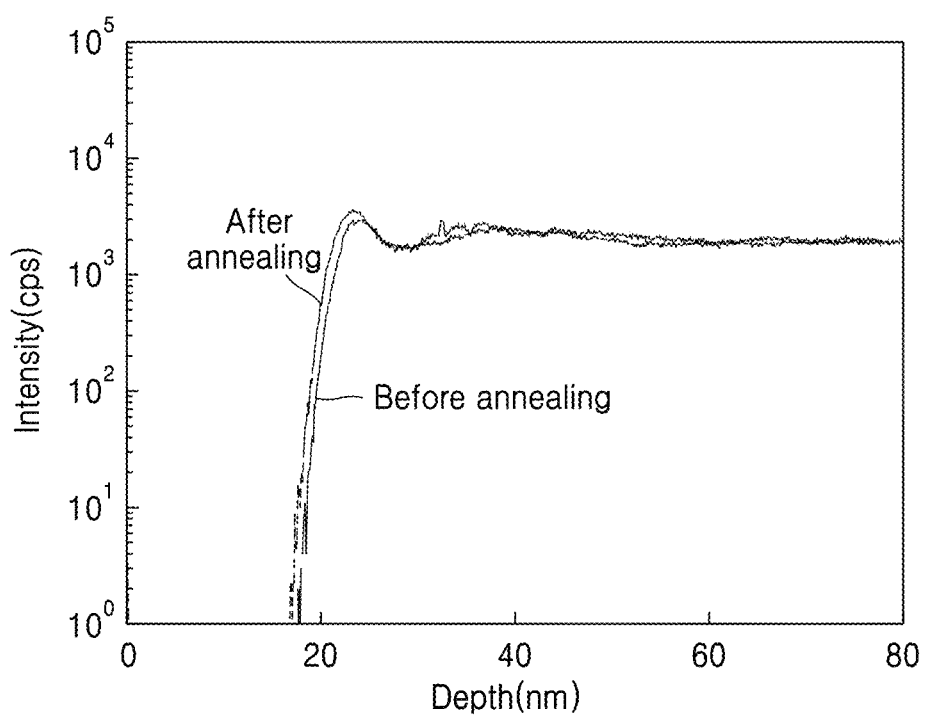
FIG. 4 is a graph showing diffusion barrier performance of a graphene layer provided in the thin film structure of FIG. 3.

FIG. 4 is a graph showing the diffusion barrier performance of a graphene layer provided in the thin film structure of FIG. 3.

A graphene layer and a tungsten layer are deposited in this order on a silicon substrate doped with phosphor, and an amount of phosphor is measured in a depth direction from a surface of the tungsten layer, before and after annealing.

The phosphor component is hardly measured in the tungsten layer, and the graphs appear similar before and after annealing. In other words, in a high-temperature process such as deposition, etc., the diffusion of phosphor doped in silicon is effectively limited and/or prevented by the graphene layer.

The structure employing the 2D material layer 150 included in the thin film structure 100 or the graphene layer 160 together with the 2D material layer 150 included in the thin film structure 101 may be used in various electronic devices. For example, the structure may be used in various memory devices utilizing a semiconductor channel and a gate electrode.

Figure 5A:
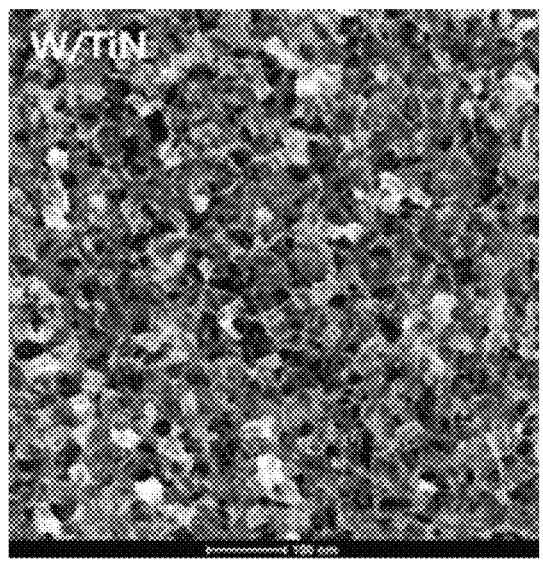
FIGS. 5A to 5C are microphotographs and graphs showing measurement results to predict resistance characteristics of the thin film structure of FIG. 3.
Figure 5B:
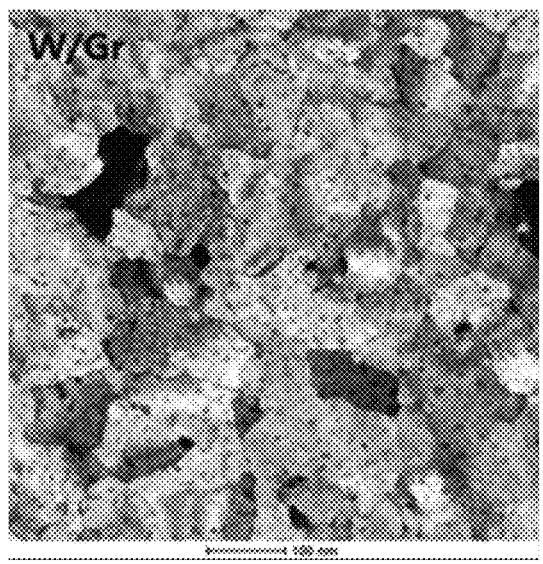
Figure 5C:
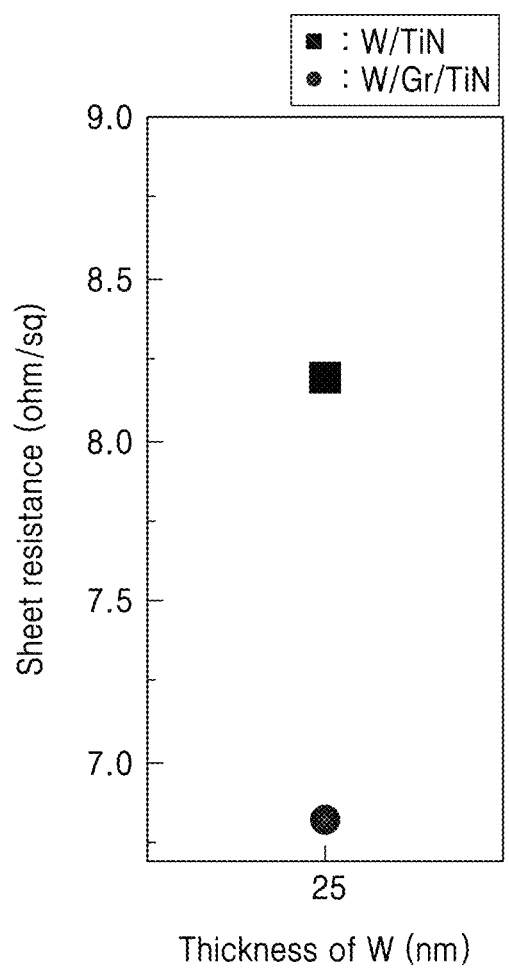

FIGS. 5A to 5C are microphotographs and graphs showing measurement results to predict resistance characteristics of the thin film structure of FIG. 3.

FIG. 5A is a PV-TEM image showing the case where W is deposited on a TiN layer, and FIG. 5B is a PV-TEM image showing the case where W is deposited on a graphene layer. FIG. 5B shows grains formed several to tens of times greater than those in FIG. 5A. The grain size is a factor affecting resistivity, and with reference to FIG. 5C, a sheet resistance of W formed on a graphene layer is lower than a sheet resistance of W formed on a TiN layer. That is, a metal layer formed on a graphene layer may have a greater grain size and a lower resistivity than a metal layer formed on TiN.

It is understood from the measurement results of FIGS. 4 and 5A to 5C that a graphene layer may function as a diffusion barrier and a liner.

Also, from the results, it is understood that functions of a diffusion barrier, a blocking layer, and a linear may be efficiently performed by using both of the 2D material layer 150 and the graphene layer 160 as in the thin film structure 101 of FIG. 3.

Figure 6:
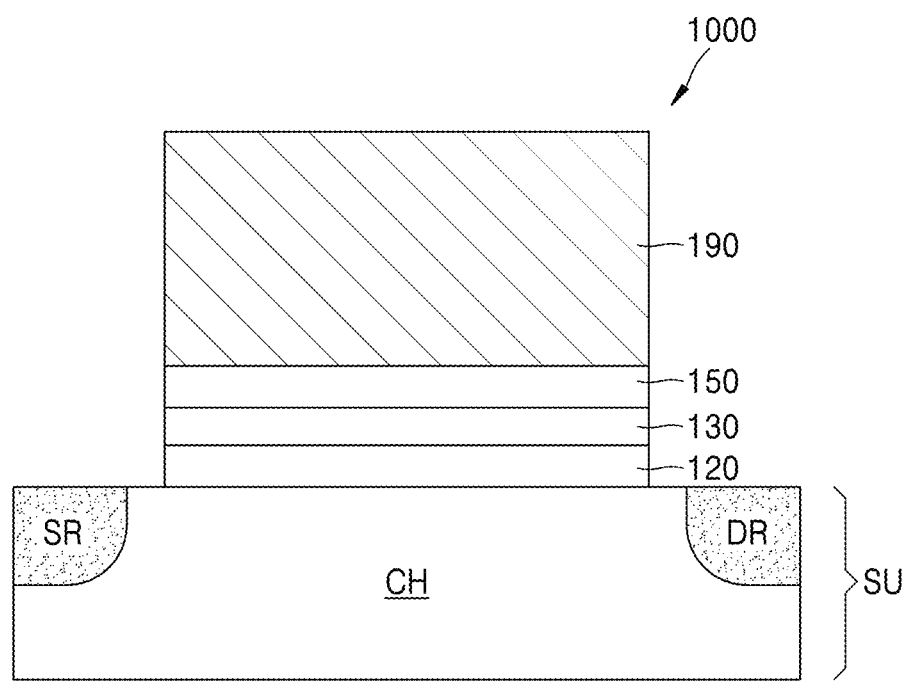
FIG. 6 is a cross-sectional view illustrating a schematic structure of an electronic device according to an embodiment.

FIG. 6 is a cross-sectional view illustrating a schematic structure of an electronic device according to an embodiment.

An electronic device 1000 may include a channel layer CH including a semiconductor material, a gate electrode 190 arranged on and spaced apart from the channel layer CH, and the 2D material layer 150 arranged between the channel layer CH and the gate electrode 190. The electronic device 1000 of the embodiment may include a charge trap layer for charge trap between the 2D material layer 150 and the channel layer CH and may be used as a memory cell based on the charge trap.

The channel layer CH may be formed in a semiconductor substrate SU. A dopant may be injected into two different regions of the semiconductor substrate SU to form a source region SR and a drain region DR, and a region between the source region SR and the drain region DR may be defined as the channel layer CH. The channel layer CH may include a p-type or an n-type dopant, and the source region SR and the drain region DR may include high concentration of dopants having a polarity identical to or different from that of a dopant injected in the channel layer CH. The source region SR and the drain region DR may include a conductive material different from that of the semiconductor substrate SU. In this case, the source region SR and the drain region DR may include, for example, a metal, a metal compound, or a conductive polymer.

The semiconductor substrate SU may include a semiconductor material. The semiconductor substrate SU may include, for example, a semiconductor material, such as silicon (Si), germanium (Ge), silicon germanium (SiGe), silicon carbide (SiC), gallium arsenic (GaAs), indium arsenic (InAs), indium phosphide (InP), etc. Alternatively, the semiconductor substrate SU may include a silicon-on-insulator (SOI) substrate.

The charge trap layer may include a trap layer 130 and a tunneling oxide layer 120. The trap layer 130 may include, for example, SiN. The tunneling oxide layer 120 may include $SiO_2$. However, the material of the trap layer 130 and the tunneling oxide layer 120 are not limited to SiN and $SiO_2$. For example, the material of the trap layer 130 may include various nitrides, polycrystalline silicon, amorphous polysilicon, etc., in addition to SiN.

The gate electrode 190 may include a metal material such as W, Mo, Co, Ru, Rh, or Ir, etc. and may also include various other conductive materials including metals, alloys, etc.

The electronic device 1000 may trap a charge flowing into the trap layer 130 from the channel layer CH through the tunneling oxide layer 120 or detrap a trapped charge according to a voltage applied to the gate electrode 190 to perform programming. Further, according a charge trapped at the trap layer 130, a current and a voltage signal between the source region SR and the drain region DR may be changed, and based on this, a state of the trap layer 130 may be identified.

The 2D material layer 150 may include various 2D insulators to limit and/or block an electron transfer between the gate electrode 190 and the channel layer CH. The 2D material layer 150 may limit and/or prevent a charge trapped at the trap layer 130 from being moved toward the gate electrode 190. The 2D material layer 150 may also lower a resistivity of the gate electrode 190 formed on the 2D material layer 150. The programming performance may be improved by the 2D material layer 150.

Figure 7:
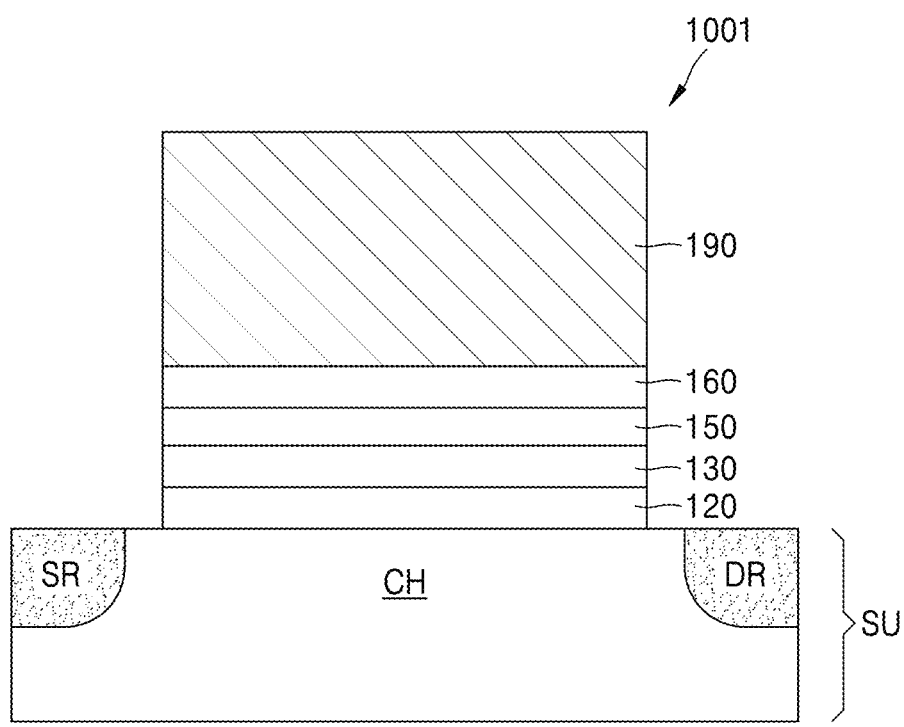
FIG. 7 is a cross-sectional view illustrating a schematic structure of an electronic device according to another embodiment.

FIG. 7 is a cross-sectional view illustrating a schematic structure of an electronic device according to another embodiment.

An electronic device 1001 of the embodiment may constitute a memory cell based on charge trap as in FIG. 6, and may be different from the electronic device 1000 of FIG. 6 in that the electronic device 1001 further includes the graphene layer 160 between the gate electrode 190 and the 2D material layer 150.

The graphene layer 160 together with the 2D material layer 150 may function as a diffusion preventing layer and a charge blocking layer, and accordingly, its performance as a diffusion barrier and a blocking layer in the electronic device 1001 may be improved.

Figure 8:
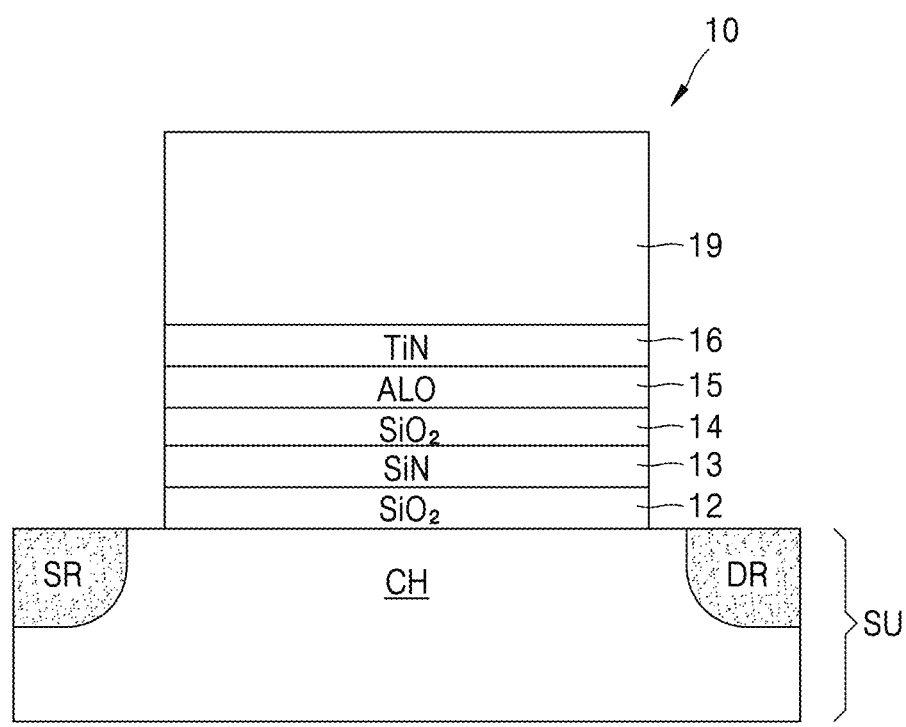
FIG. 8 is a cross-sectional view illustrating a schematic structure of an electronic device according to a comparative example.

FIG. 8 is a cross-sectional view illustrating a schematic structure of an electronic device according to a comparative example.

An electronic device 10 of a comparative example may be a device constituting a memory cell based on charge trap as in FIGS. 6 and 7 and may include a $SiO_2$ layer 12, a SiN layer 13, a $SiO_2$ layer 14, a AlO layer 15, a TiN layer 16, and a gate electrode 19 arranged in this order on the channel layer CH. The $SiO_2$ layer 12 and the SiN layer 13 may be a tunneling oxide layer and a trap layer, respectively, and the $SiO_2$ layer 14 and the AlO layer 15 may be a layer functioning as a blocking layer and a linear. The TiN layer 16 may function as a diffusion preventing layer. The electronic device 10 of a comparative example may perform the functions of the 2D material layer 150 of the electronic device 1000 or the functions of the graphene layer 160 and the 2D material layer 150 of the electronic device 1001 of embodiments by using three material layers: the $SiO_2$ layer 14, the AlO layer 15, and the TIN layer 16. That is, in the electronic device 1000 and the electronic device 1001 of the embodiments, the functions of diffusion prevention, charge blocking, etc. may be performed with a simpler stacked structure, compared to the case of the comparative example.

Figure 9:
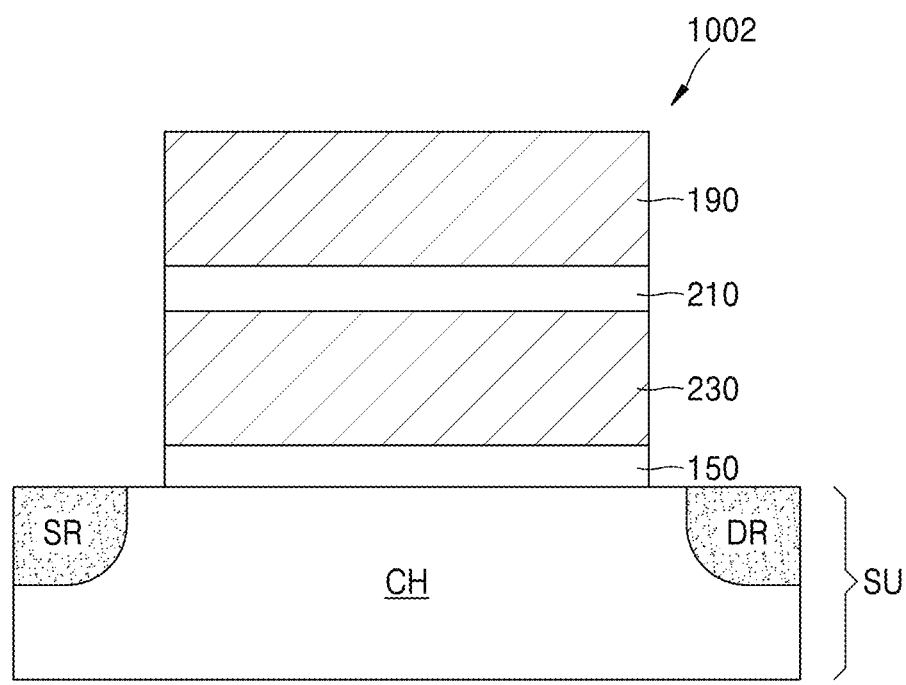
FIG. 9 is a cross-sectional view illustrating a schematic structure of an electronic device according to another embodiment.

FIG. 9 is a cross-sectional view illustrating a schematic structure of an electronic device according to another embodiment.

An electronic device 1002 of the embodiment may have a structure which may be used as a memory cell based on a ferroelectric. The electronic device 1002 may include the 2D material layer 150, a conductive layer 230, a ferroelectric layer 210, and the gate electrode 190 sequentially formed on the channel layer CH.

The ferroelectric layer 210 may include a material having ferroelectricity to maintain spontaneous polarization by aligning internal electric dipole moments even when an electric field is applied from the outside. The ferroelectric layer 210 may include a material of which polarization value remains in the material permanently even when a certain voltage is applied and then the voltage is adjusted back to 0V, and a polarity (direction) of such remaining polarization may depend on a polarity (direction) of a voltage applied from the outside. That is, the ferroelectric layer 210 may have a remaining polarization corresponding to a low logical value (data "0") or a high logical value (data "1") according to a voltage applied to the gate electrode 190. Also, according to such polarization direction of the ferroelectric layer 210, a conductance difference between the source region SR and the drain region DR may be generated, and based on this, a state of remaining polarization may be identified.

The ferroelectric layer 210 may include a hafnium oxide ($HfO_2$), a zirconium oxide ($ZrO_2$), or a hafnium-zirconium oxide ($Hf_xZr_{1-x}O_2$, 0<x<1), and may further include a dopant material such as C, Si, Ge, Sn, Pb, Al, Y, La, Gd, Mg, Ca, Sr Ba, Ti, Zr, or Hf.

The conductive layer 230 may be provided to well maintain the crystal phase of the ferroelectric layer 210. The conductive layer 230 may include a metal material such as W, Mo, Co, Ru, Rh, or Ir, etc. and may also include various other conductive materials including metals, alloys, etc. The conductive layer 230 may be referred to as a floating electrode.

In the electronic device 1002 of the embodiment, the 2D material layer 150 may function a blocking layer and a liner with respect to the conductive layer 230. That is, a dopant material included in the channel layer CH may be limited and/or prevented from being diffused toward the conductive layer 230, and the resistivity of the conductive layer 230 may be lowered.

Figure 10:
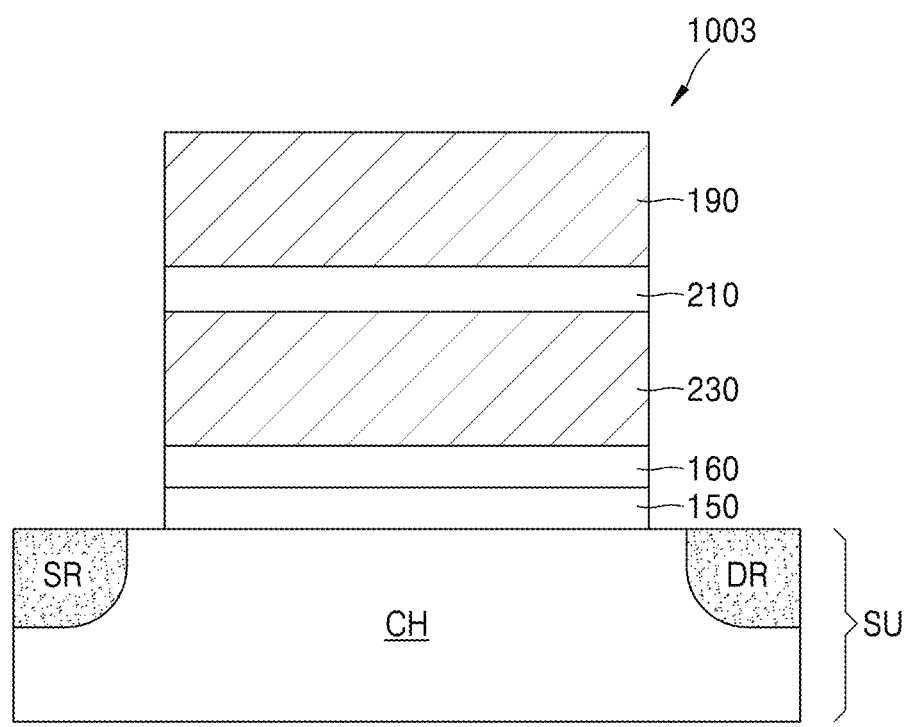
FIG. 10 is a cross-sectional view illustrating a schematic structure of an electronic device according to another embodiment.

FIG. 10 is a cross-sectional view illustrating a schematic structure of an electronic device according to another embodiment.

An electronic device 1003 of the embodiment may be used as a memory cell based on a ferroelectric as in FIG. 9, and may be different from the electronic device 1002 of FIG. 9 only in that the electronic device 1003 further includes the graphene layer 160 between the 2D material layer 150 and the conductive layer 230. Accordingly, any redundant descriptions thereon are omitted. The electronic device 1003 of the embodiment may have improved performance as a diffusion barrier and a blocking layer by further including the graphene layer 160. For example, a dopant material included in the channel layer CH may be effectively limited and/or prevented from being diffused toward the conductive layer 230 during a high-temperature manufacturing process.

As such, by using the 2D material layer 150 or the graphene layer 160 together with the 2D material layer 150 in a ferroelectric memory device, the performance of memory may be improved and an operating voltage may be decreased.

Figure 11:
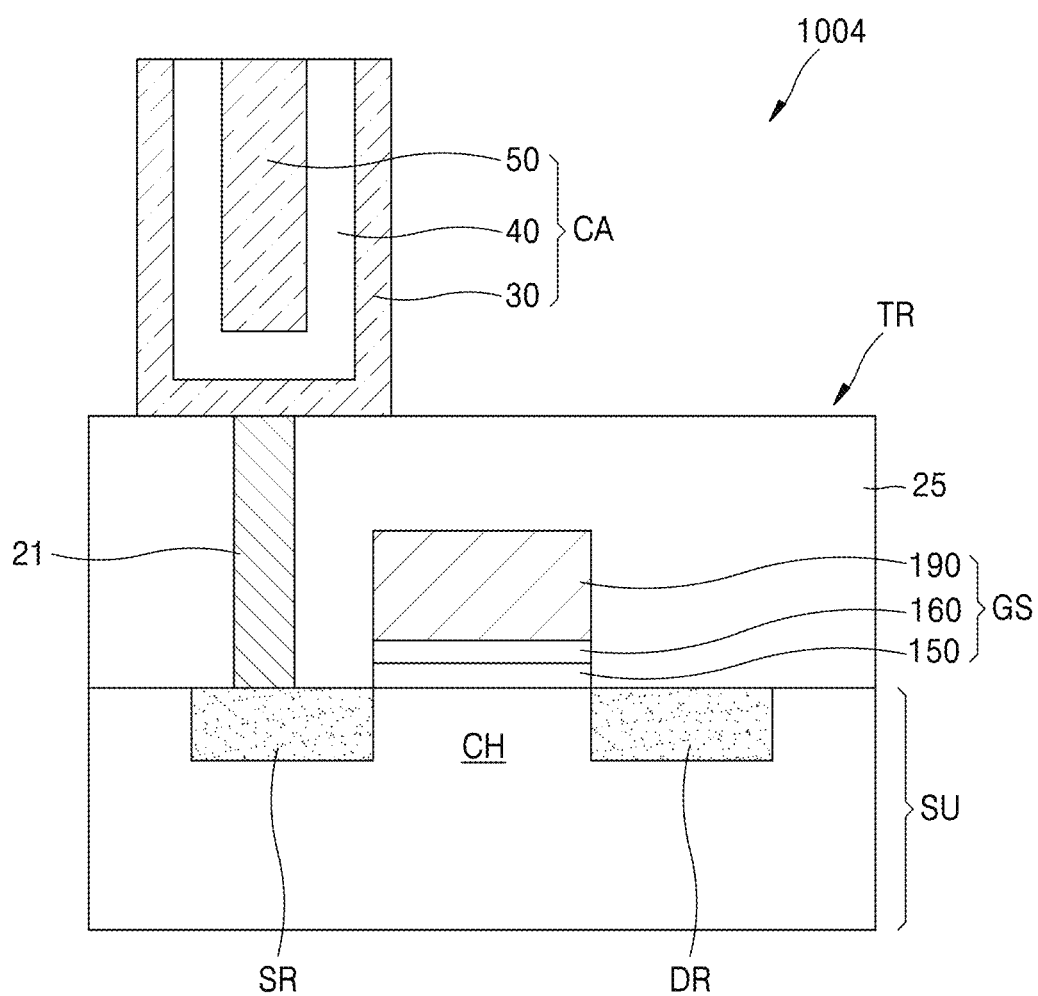
FIG. 11 is a cross-sectional view illustrating a schematic structure of an electronic device according to another embodiment.

FIG. 11 is a cross-sectional view illustrating a schematic structure of an electronic device according to another embodiment.

An electronic device 1004 of the embodiment may have a structure in which a capacitor CA is electrically connected to a transistor TR, and may be used as a cell of a dynamic random access (DRAM) device.

The transistor TR may include the channel layer CH and a gate stack GS including the 2D material layer 150, the graphene layer 160, and the gate electrode 190 on the channel layer CH.

The capacitor CA may be electrically connected to the channel layer CH, and for example, may be connected to the source region SR through a contact 21 as described in the drawings.

An interlayer dielectric 25 may be formed to cover the gate stack GS on the semiconductor substrate SU. The interlayer dielectric 25 may include an insulator. For example, the interlayer dielectric 25 may include a Si oxide (e.g., $SiO_2$), an Al oxide (e.g., $Al_2O_3$), or a high-k material (e.g., $HfO_2$). The contact 21 may electrically connect the transistor TR to the contact 21 by penetrating the interlayer dielectric 25.

The capacitor CA may include a lower electrode 30, an upper electrode 50, and a dielectric thin film 40 arranged between the lower electrode 30 and the upper electrode 50. The lower electrode 30 and the upper electrode 50 may be provided in a structure to maximize a contact area with the dielectric thin film 40, but the structure is not limited to the structure described in the drawings.

Figure 12:
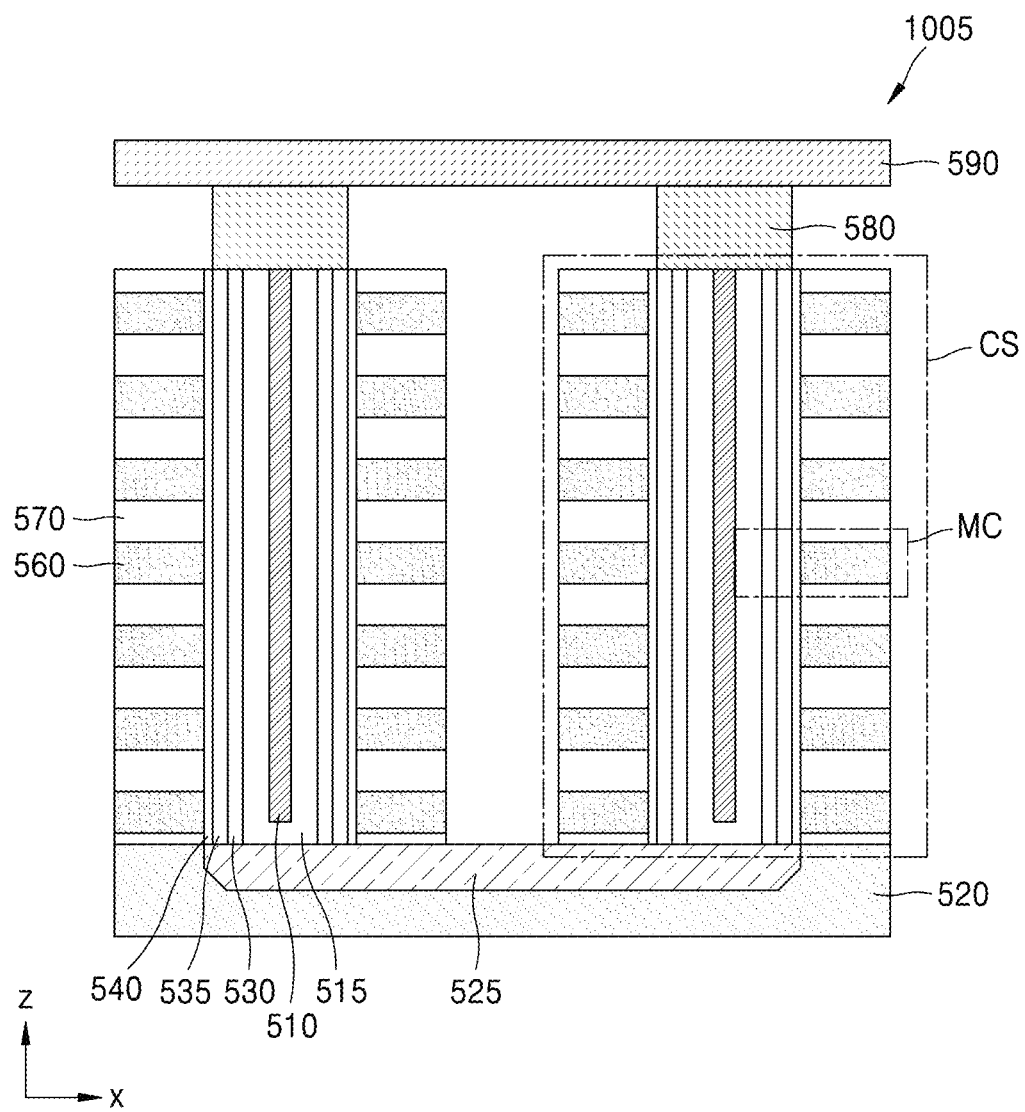
FIG. 12 is a cross-sectional view illustrating a schematic structure of an electronic device according to another embodiment.

The gate stack GS may include the 2D material layer 150 and the graphene layer 160 as described above to lower the resistivity of the gate electrode 190, and prevent a dopant included in the channel layer CH from being diffused toward the gate electrode 190. Accordingly, the memory performance of the DRAM device may be improved, and an operating voltage may be decreased. FIG. 12 is a cross-sectional view illustrating a schematic structure of an electronic device according to another embodiment.

An electronic device 1005 of the embodiment may be a flash NAND device based on charge trap.

The electronic device 1005 may have a structure in which memory cells MC including a channel layer 515, a tunneling oxide layer 530, a trap layer 535, a 2D material layer 540, and a gate electrode 560 are stacked in a vertical direction (Z direction). The stacking direction (Z direction) of the memory cells MC may be perpendicular to a direction in which the channel layer 515, the tunneling oxide layer 530, the trap layer 535, the 2D material layer 540, and the gate electrode 560 constituting the memory cell MC are stacked (X direction).

A plurality of memory cells MC may constitute a cell string CS having a column shape, and a plurality of cell strings CS may be arranged in a 2D manner. The cell string CS may have a cylindrical shape, but the present disclosure is not limited thereto, and the cell string CS may also have, for example, a shape of a square pillar. Although two cell strings CS are described in the drawings, such description is provided merely as an example, and the number of the memory cells MC included in the cell strings CS is also provided as an example. A plurality of cell strings CS including a certain number of memory cells MC may be arranged in the X direction and Y direction in a 2D manner.

The cell string CS may be arranged on a substrate 520. The substrate 520 may be a semiconductor substrate, and may include, for example, silicon doped with a p-type or n-type dopant.

A source region 525 may be provided on the substrate 520. The source region 525 may include a dopant having a polarity different from that of a dopant included in the substrate 520.

The cell string CS may have a cylindrical shape or a shape of a rectangular pillar. For example, a surface of a cylindrical insulator 510 may be surrounded by the channel layer 515, the tunneling oxide layer 530, the trap layer 535, and the 2D material layer 540 in this stated order. A plurality of gate electrodes 560 may surround the 2D material layer 540, and may be spaced apart from each other in the Z direction. A plurality of insulators 570 may be arranged between the plurality of gate electrodes 560, and, that is, the plurality of insulators 570 may also surround the 2D material layer 540 and be spaced apart from each other in the Z direction.

The gate electrode 560 may include W, Mo, Co, Ru, Rh, or Ir and may also include various other metals, alloys, and conductive materials.

The insulator 570 may include various insulators such as a silicon oxide, a silicon nitride, etc.

The channel layer 515 may include a semiconductor material. The channel layer 515 may include poly-Si. The channel layer 515 may include a silicon material doped with the same type of dopant as in the substrate 520, and for example, when the substrate 520 includes a silicon material doped with a p-type dopant, the channel layer 515 may also include a silicon material doped with a p-type dopant. Alternatively, the channel layer 515 may include Ge, IGZO, GaAs, etc.

The channel layer 515 may be in contact with an end of the source region 525.

A drain region 580 may be provided on the cell string CS. The drain region 580 may include a silicon material doped with an n-type dopant, but the present disclosure is not limited thereto.

A bit line 590 may be provided on the drain region 580.

The source region 525 may be connected to a common source line commonly connected to the plurality of cell strings CS. Each of the plurality of cell strings CS may include a string select transistor. Rows of the plurality of cell strings CS may be respectively connected to different string select lines, and columns of the plurality of cell strings CS may be respectively connected to different bit lines. The rows of the plurality of cell strings CS may be respectively connected to different common source lines.

The gate electrodes 560 of the memory cells MC arranged at the same height from the substrate 520 may be commonly connected to one word line, and the gate electrodes 560 of the memory cells MC arranged at different heights may be respectively connected to different word lines.

When a memory cell MC to record is selected, a region of the channel layer 515 corresponding to a selected cell may become ON, and a voltage to move charges to the trap layer 535 from the channel layer 515 through the tunneling oxide layer 530 may be applied to the gate electrode 560. A corresponding region of the channel layer CH of unselected memory cells MC may become ON, and a voltage may be applied to the gate electrode 560 such that charges do not move to the trap layer 535 from the channel layer CH. As such, a current flow may be formed through the channel layer 515, and charge trap may be performed only at the trap layer 535 corresponding to a selected memory cell MC. As such, 1 or 0 may be recorded according to charge trap of the trap layer 535 of each memory cell MC.

The electronic device 1005 according to an embodiment may improve the blocking performance and also have a thin thickness by the 2D material layer 540. Also, the electronic device 1005 may lower the resistivity of the gate electrode 560, and accordingly, may reduce an operating voltage for charge trap of the trap layer 535.

Each memory cell MC included in the cell string CS in the structure illustrated in the drawings is described as including the channel layer 515, the tunneling oxide layer 530, the trap layer 535, the 2D material layer 540, and the gate electrode 560 as in the electronic device 1001 of FIG. 6; however, the memory cell MC may be modified to further include the graphene layer 160 between the 2D material layer 540 and the gate electrode 560 as in FIG. 7.

Figure 13A:
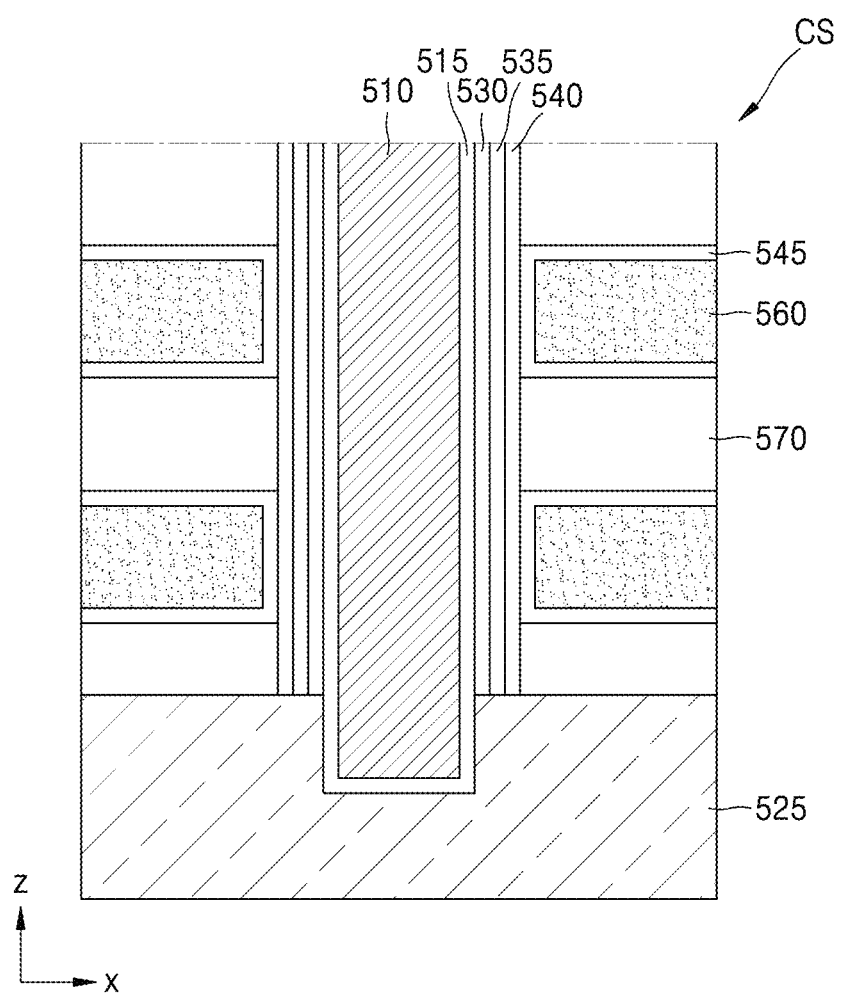
FIGS. 13A, 13B, and 13C, are cross-sectional views showing another example structure of a cell string which may be included in the electronic device of FIG. 12.
Figure 13B:
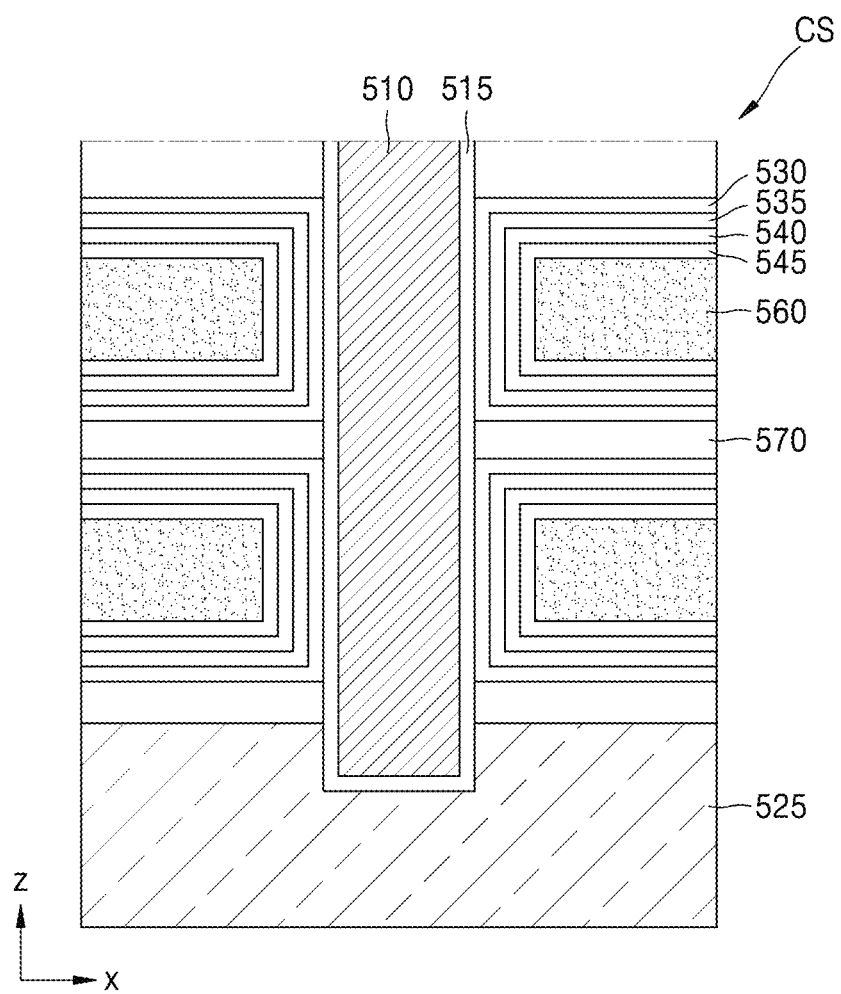
Figure 13C:
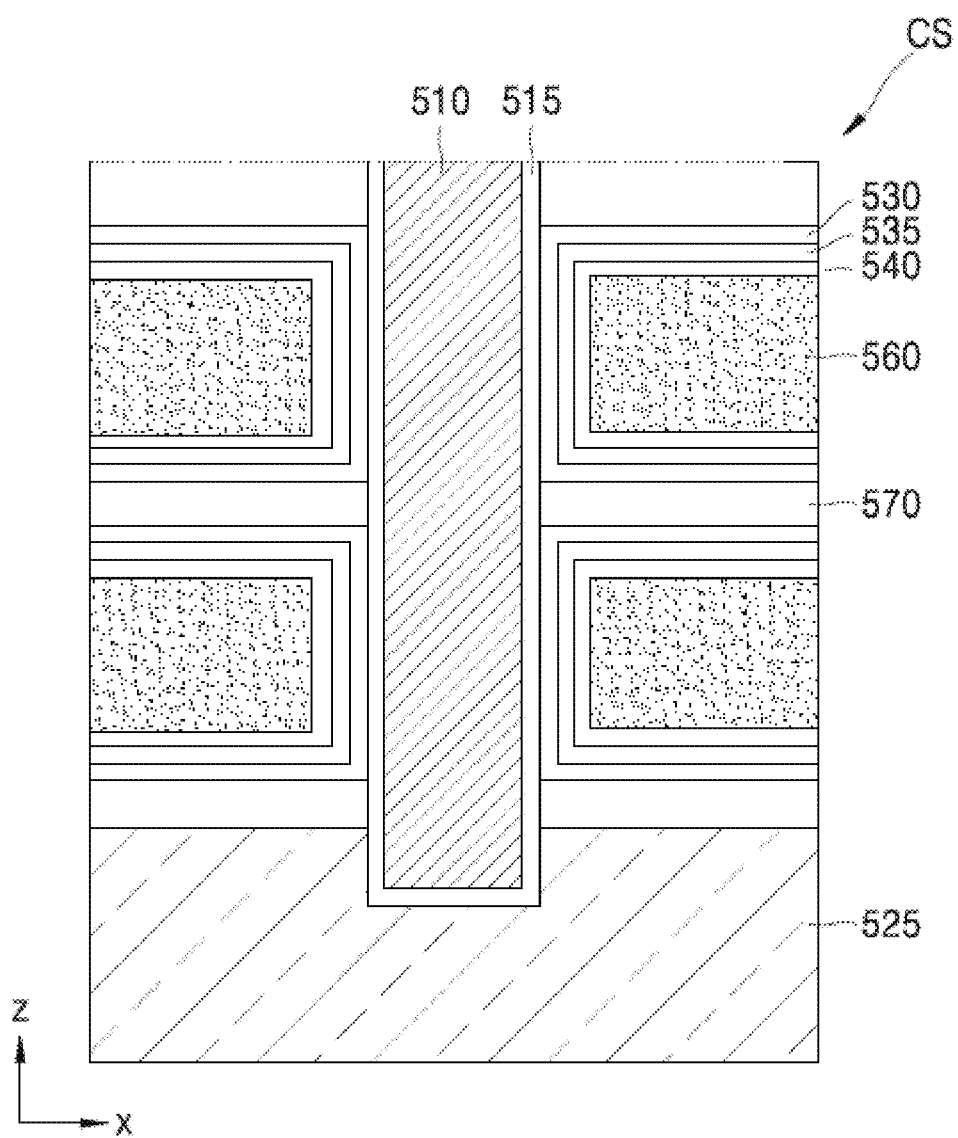

FIGS. 13A, 13B, and 13C, are cross-sectional views showing another example structure of a cell string which may be included in the electronic device of FIG. 12.

With reference to FIG. 13A, the channel layer 515, the tunneling oxide layer 530, the trap layer 535, and the 2D material layer 540 are arranged in this stated order from a surface of an insulator 510, and a graphene layer 545 may be arranged between the gate electrode 560 and the insulator 570, and between the gate electrode 560 and the 2D material layer 540.

With reference to FIG. 13B, the channel layer 515, the tunneling oxide layer 530, the trap layer 535, the 2D material layer 540, and the graphene layer 545 may be arranged in this stated order from the surface of the insulator 510. Also, the tunneling oxide layer 530, the trap layer 535, the 2D material layer 540, and the graphene layer 545 may be arranged to surround three sides of the gate electrode 560 in this stated order from the outermost side.

In the structure of cell string CS of FIG. 13B, the graphene layer 545 may be omitted. FIG. 13C illustrates a cross-sectional view that is similar to FIG. 13B, except the graphene layer 545 is omitted.

Figure 14A:
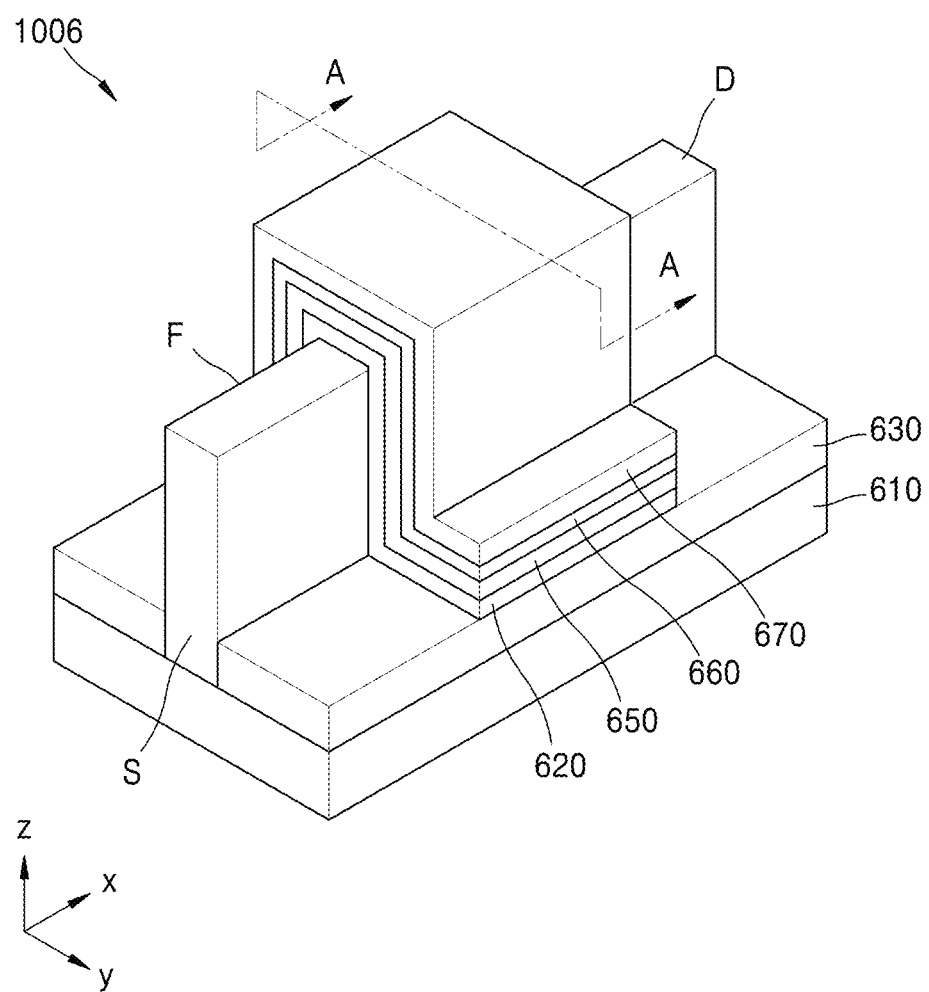
FIG. 14A is a cross-sectional view illustrating a schematic structure of an electronic device according to another embodiment.

FIG. 14A is a cross-sectional view illustrating a schematic structure of an electronic device according to another embodiment.

Figure 14B:
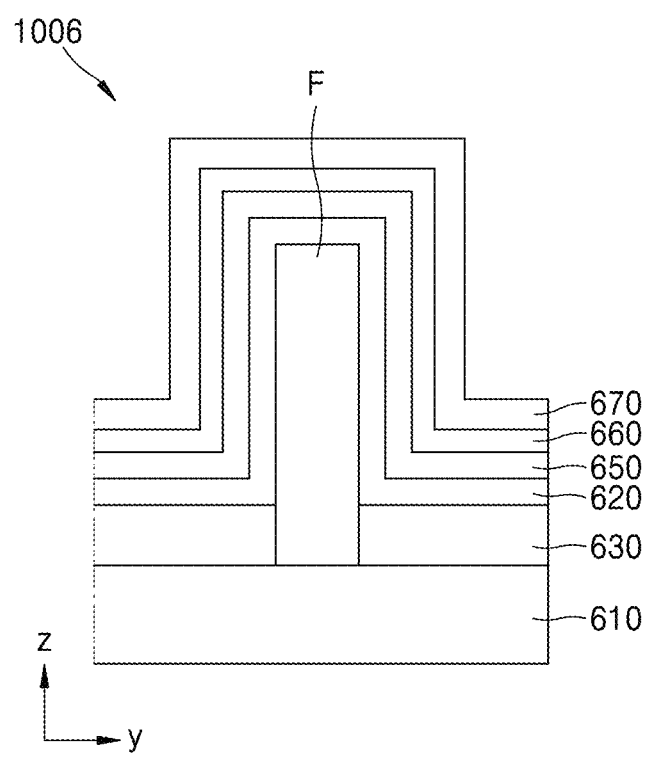
FIG. 14B is a cross-sectional view taken along line A-A in FIG. 14A.

FIG. 14B is a cross-sectional view taken along line A-A in FIG. 14A.

Referring to FIGS. 14A and 14B, an electronic device 1006 according to another embodiment may have a fin-type structure. The electronic device may include a substrate 610, a fin F extending in a first direction X on the substrate 610 and protruding in a vertical direction Z from an upper surface of the substrate 610, and an insulating layer 630 on the substrate 610 and surrounding the fin F. The fin F may be formed of a semiconductor material such as silicon or silicon germanium. The fin F may include a source S and a drain D spaced apart from each other.

A gate structure may extend in a second direction Y and cross over the fin F. The gate structure may cross over a portion of the fin F between the source S and the drain D. The gate structure may include a gate insulating layer 620, a 2D material layer 650, a graphene layer 660, and a gate electrode 670 sequentially formed on the fin F. Optionally, the graphene layer 660 may be omitted. The gate electrode 670 may directly contact the graphene layer 660 or may directly contact the 2D material layer 650 if the graphene layer 660 is omitted.

The substrate 610 may include a semiconductor such as silicon and may be doped with a p-type or n-type dopant. The insulating layer 630 may include an insulating material such as silicon oxide. The gate insulating layer 620 may include silicon oxide, aluminum oxide, or a high-k material (e.g., $HfO_2$). The 2D material layer 650 may include any one of the materials described above for the 2D material layer 150 in FIG. 1. The gate electrode 670 may include a metal material such as W, Mo, Co, or an alloy thereof, and may include other conductive materials.

The aforementioned electronic devices in FIGS. 6-7, 9-12, 13A, 13B, 14A, and 14B may be applied as a memory cell array and may be employed as a memory system of various electronic apparatuses.

Figure 15:
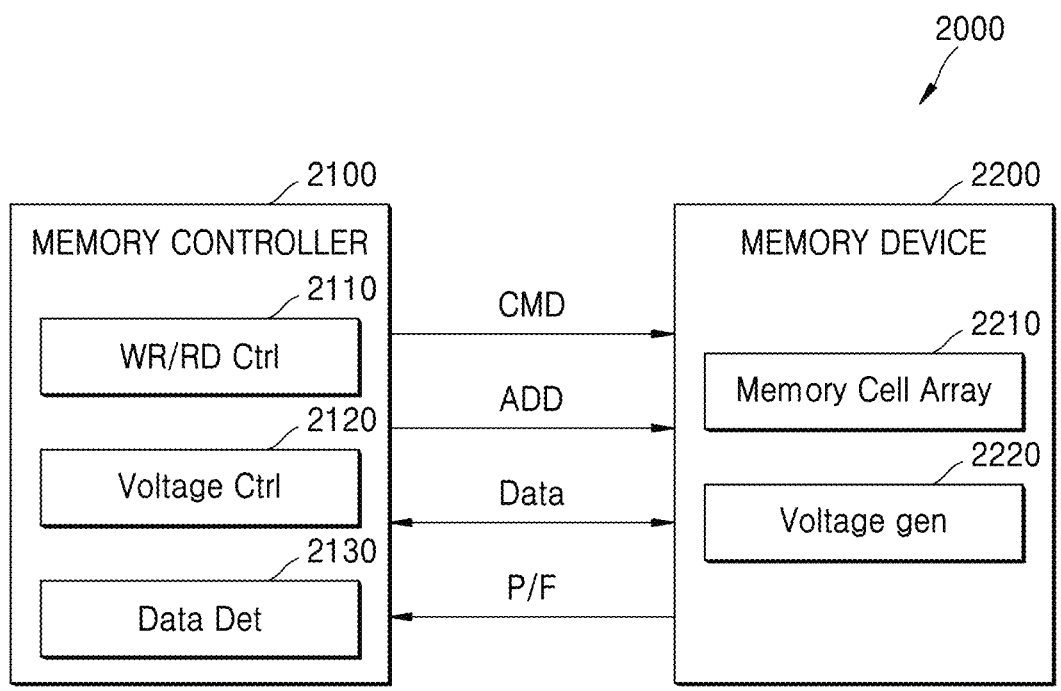
FIG. 15 is a block diagram schematically showing a structure of an electronic apparatus according to an embodiment.
Figure 16:
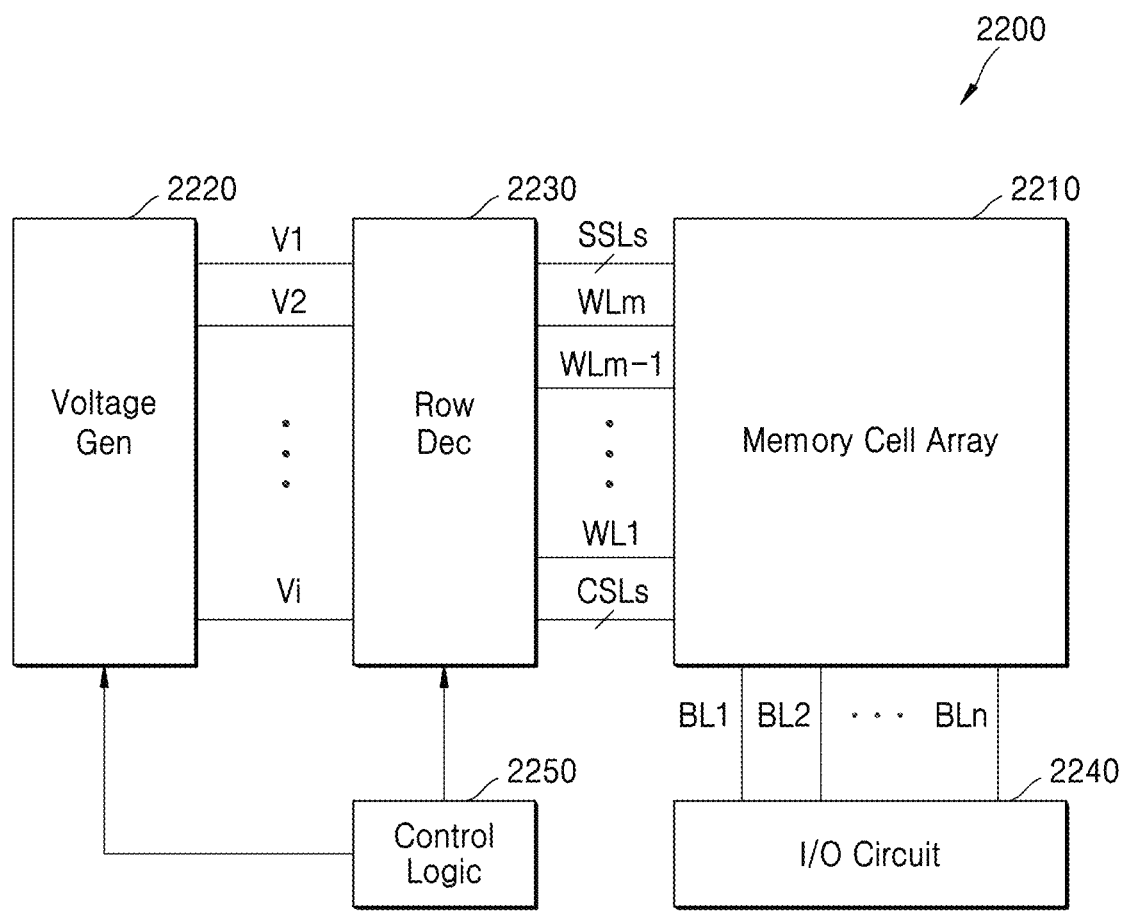
FIG. 16 is a block diagram showing an implementation example of a memory device provided in the electronic apparatus of FIG. 15.

FIG. 15 is a block diagram schematically illustrating a structure of an electronic apparatus according to an embodiment, and FIG. 16 is a block diagram illustrating an implementation example of a memory device provided in the electronic apparatus of FIG. 15.

With reference to FIG. 15, a memory system 2000 according to an embodiment may include a memory controller 2100 and a memory device 2200. The memory controller 2100 may perform control operations for the memory device 2200, and for example, the memory controller 2100 may provide an address ADD and a command CMD to the memory device 2200 to perform a program (or write) operation, a read operation, and an erase operation on the memory device 2200. Further, data for a program operation and read data may be received and transmitted between the memory controller 2100 and the memory device 2200.

The memory device 2200 may include a memory cell array 2210 and a voltage generator 2220. The memory cell array 2210 may include a plurality of memory cells arranged at areas where a plurality of words lines and a plurality of bit lines intersect. The memory cell array 2210 may include non-volatile memory cells which store data in a non-volatile manner, and may include as the non-volatile memory cells, flash memory cells such as a NAND flash memory cell array, a NOR flash memory cell array, etc. The memory cell array 2210 may include the electronic device 1005 of FIG. 12, which may be a flash NAND device based on charge trap, and in addition to this, may also include a memory cell applying the electronic device 1002 and electronic device 1003 of other embodiments. In some embodiments, the memory cell array 2210 may include the electronic device 1006 of FIGS. 14A and 14B. In other embodiments, the memory cell array 2210 may include the electronic device 1000 or 10001 of FIGS. 6 and 7.

The memory controller 2100 may include a write/read controller 2110, a voltage controller 2120, and a data determiner 2130.

The write/read controller 2110 may generate an address ADD and a command CMD to perform program, read, and erase operations for the memory cell array 2210. Also, the voltage controller 2120 may generate a voltage control signal to control at least one voltage level used in the non-volatile memory device 2200. For example, the voltage controller 2120 may generate a voltage control signal to control a voltage level of a word line to read data from the memory cell array 2210 or to program data to the memory cell array 2210.

The data determiner 2130 may perform a determination operation regarding data read from the memory device 2200. For example, the data determiner 2130 may determine the numbers of on cells and/or off cells among the memory cells by determining data read from the memory cells. For example, when a program is performed with respect to the plurality of memory cells, by determining states of data of the memory cells by using a certain read voltage, whether the program has been normally completed may be determined with respect to every cells.

With reference to FIG. 16, the memory device 2200 may further include a row decoder 2230, an input/output circuit 2240, and a control logic 2250.

The memory cell array 2210 may be connected to one or more string select lines SSLs, a plurality of word lines WL1 to WLm, one or more common source lines CSLs, and a plurality of bit lines BL1 to BLn.

Here, the string select lines SSLs may be lines respectively connected to, for example, the plurality of cell strings CS illustrated in FIG. 12, and the word lines WL1 to WLm may be lines connected to the gate electrode 560 of the memory cells MC arranged at different heights in the plurality of cell strings CS illustrated in FIG. 12. The common source lines CSLs may be lines commonly connected to the string select transistors provided at each of the plurality of cell strings CS illustrated in FIG. 12. The bit lines BL1 to BLn may be lines respectively connected to different columns of the plurality of cell strings CS illustrated in FIG. 12.

The voltage generator 2220 may generate one or more word line voltages V1 to Vi, and the word line voltages V1 to Vi may be provided to the row decoder 2230. A signal for a program/read/erase operation may be applied to the memory cell array 2210 through the bit lines BL1 to BLn.

Also, data to be programmed may be provided to the memory cell array 2210 through the input/output circuit 2240, and read data may be provided to the outside (e.g., a memory controller) through the input/output circuit 2240. The control logic 2250 may provide control signals related to memory operations to the row decoder 2230 and the voltage generator 2220.

The word line voltages V1 to Vi may be provided to various lines (SSLs, WL1 to WLm, and CSLs) according to a decoding operation of the row decoder 2230. For example, the word line voltages V1 to Vi may include a string select voltage, a word line voltage, and a ground select voltage. The string select voltage may be provided to one or more string select lines SSLs. The word line voltage may be provided to one or more word lines WL1 to WLm. The ground select voltage may be provided to one or more common source lines CSLs.

The thin film structure described above may effectively limit and/or block an electron transfer between a substrate and a metal layer by using a 2D material layer, and may lower a resistivity of a metal layer formed on the 2D material layer.

The electronic device described above may effectively limit and/or block an electron transfer between a gate electrode or other conductive materials and a channel by using a 2D material layer, and may lower a resistivity of the gate electrode or other conductive materials.

The electronic device may be used as various memory devices, and may have a low operating voltage.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film structure comprising:
a substrate;
a metal layer on the substrate and spaced apart from the substrate; and
a two-dimensional material layer between the substrate and the metal layer, the two-dimensional material layer being configured to block an electron transfer between the metal layer and the substrate, wherein
the two-dimensional material layer covers a top surface of the metal layer, a side surface of the metal layer, and a lower surface of the metal layer.

2. The thin film structure of claim 1, wherein a resistivity of the metal layer is decreased by the two-dimensional material layer.

3. The thin film structure of claim 1, wherein the two-dimensional material layer includes a two-dimensional insulator.

4. The thin film structure of claim 3, wherein the two-dimensional insulator includes BN, $MnO_2$, $MoO_3$, GaSe, $Ga_2N_3$, or $As_2S_3$.

5. The thin film structure of claim 3, further comprising:
a graphene layer between the two-dimensional material layer and the metal layer.

6. The thin film structure of claim 5, wherein
the metal layer is directly on the graphene layer.

7. The thin film structure of claim 1, wherein the metal layer includes W, Mo, Co, Ru, Rh, or Ir.

8. The thin film structure of claim 1, wherein
the metal layer is directly on the two-dimensional material layer.

9. An electronic device comprising:
a channel layer including a semiconductor material;
a gate electrode on the channel layer and spaced apart from the channel layer; and
a two-dimensional material layer between the channel layer and the gate electrode, the two-dimensional material layer being configured to block an electron transfer between the gate electrode and the channel layer; and
a charge trap layer between the channel layer and the two-dimensional material layer, the charge trap layer including a trap layer and a tunneling oxide layer.

10. The electronic device of claim 9, wherein the two-dimensional material layer includes a two-dimensional insulator.

11. The electronic device of claim 10, wherein the two-dimensional insulator includes BN, $MnO_2$, $MoO_3$, GaSe, $Ga_2N_3$, or $As_2S_3$.

12. The electronic device of claim 9, further comprising:
a graphene layer between the two-dimensional material layer and the gate electrode.

13. The thin film structure of claim 1, further comprising:
a charge trap layer between the substrate and the two-dimensional material layer, wherein
the charge trap layer includes a trap layer and a tunneling oxide layer.

14. The electronic device of claim 9, wherein
the two-dimensional material layer is between the channel layer and a side surface of the gate electrode.

15. The electronic device of claim 9, wherein the channel layer includes poly-Si.

16. The electronic device of claim 9, comprising:
a plurality of memory cells that each include the channel layer, the charge trap layer, the two-dimensional material layer, and the gate electrode,
wherein the plurality of memory cells are arranged in a direction perpendicular to a direction in which the channel layer, the charge trap layer, the two-dimensional material layer, and the gate electrode are arranged.

17. The electronic device of claim 16, further comprising:
a column-shaped insulator,
wherein the channel layer, the charge trap layer, the two-dimensional material layer, and the gate electrode surround a lateral side of the column-shaped insulator
the channel layer is between the lateral side of the column-shaped insulator and the two-dimensional material layer, and
the charge trap layer is between the channel layer and the two-dimensional material layer.

18. The electronic device of claim 17, further comprising:
a graphene layer between the gate electrode and the two-dimensional material layer.

19. An electronic apparatus comprising:
a memory device including a plurality of memory cells; and
a memory controller configured to control the memory device,
wherein each of the plurality of memory cells comprises a channel layer, a gate electrode, a two-dimensional material layer, and a memory layer,
the channel layer includes a semiconductor material,
the gate electrode is on the channel layer and spaced apart from the channel layer,
the two-dimensional material layer is between the channel layer and the gate electrode,
the two-dimensional material layer is configured to block an electron transfer between the gate electrode and the channel layer, and
the memory layer is between the channel layer and the gate electrode.

20. The electronic apparatus of claim 19, wherein the memory layer includes a charge trap layer or a ferroelectric layer.

* * * * *